US007722928B2

(12) United States Patent
Mirkin et al.

(10) Patent No.: US 7,722,928 B2
(45) Date of Patent: May 25, 2010

(54) NANOLITHOGRAPHY METHODS AND PRODUCTS THEREFOR AND PRODUCED THEREBY

(75) Inventors: Chad A. Mirkin, Wilmette, IL (US); Seunghun Hong, Chicago, IL (US); Vinayak P. Dravid, Glenview, IL (US)

(73) Assignee: Northwestern University, Evanston, IL (US)

(*) Notice: Subject to any disclaimer, the term of this patent is extended or adjusted under 35 U.S.C. 154(b) by 819 days.

(21) Appl. No.: 11/100,483

(22) Filed: Apr. 7, 2005

(65) Prior Publication Data

US 2005/0191434 A1  Sep. 1, 2005

Related U.S. Application Data

(63) Continuation of application No. 10/059,593, filed on Jan. 28, 2002, now abandoned, and a continuation-in-part of application No. 10/449,685, filed on Jun. 2, 2003, which is a continuation-in-part of application No. 09/477,997, filed on Jan. 5, 2000, now Pat. No. 6,635,311, said application No. 10/449,685 is a continuation of application No. 09/477,997.

(60) Provisional application No. 60/264,550, filed on Jan. 26, 2001, provisional application No. 60/115,133, filed on Jan. 7, 1999, provisional application No. 60/157,633, filed on Oct. 4, 1999.

(51) Int. Cl.
| *B05D 5/00* | (2006.01) |
|---|---|
| *B05D 1/36* | (2006.01) |
| *B05D 7/24* | (2006.01) |
| *B01J 19/08* | (2006.01) |
| *C12Q 1/68* | (2006.01) |
| *C12P 19/34* | (2006.01) |

(52) U.S. Cl. .......... 427/256; 118/664; 427/287; 427/457; 427/595; 427/598
(58) Field of Classification Search .......... 427/457, 427/256
See application file for complete search history.

(56) References Cited

U.S. PATENT DOCUMENTS 5,936,237 A * 8/1999 van der Weide ............ 250/234

(Continued)

FOREIGN PATENT DOCUMENTS

JP   09-251979 A   9/1997

(Continued)

OTHER PUBLICATIONS

Jaschke, et al., "Deposition of Organic material by the Tip of a Scanning force Microscope", Langmuir, vol. 11, pp. 1061-1064 (1995).

(Continued)

*Primary Examiner*—Michael Kornakov
*Assistant Examiner*—Alexander Weddle
(74) *Attorney, Agent, or Firm*—Foley & Lardner LLP

(57) ABSTRACT

In one aspect, a method of nanolithography is provided using a driving force to control the movement of a deposition compound from a scanning probe microscope tip to a substrate. Another aspect of the invention provides a tip for use in nanolithography having an internal cavity and an aperture restricting movement of a deposition compound from the tip to the substrate. The rate and extent of movement of the deposition compound through the aperture is controlled by a driving force.

30 Claims, 3 Drawing Sheets

U.S. PATENT DOCUMENTS

2008/0113099 A1* 5/2008 Mirkin et al. ............... 427/287

FOREIGN PATENT DOCUMENTS

| JP | 09251979 A * | 9/1997 |
| WO | WO 00/41213 A1 | 7/2000 |
| WO | WO00/41213 A1 * | 7/2000 |

OTHER PUBLICATIONS

Mirkin, et al., U.S. Appl. No. 11/933,181, filed Oct. 32, 2007, Non-final Office Action dated Nov. 18, 2008 with PTO-Form 892 (14 pages).

* cited by examiner

Size-and shape specific hole (A) Top-view:
Fabricated Microcontainer
e.g. AFM cantilever prism (B) Side-View:
Fabricated Microcontainer
e.g. AFM cantilever prism (C) Side-View:
Fabricated Microcontainer
e.g. AFM cantilever prism
suspended in liquid with desired charged
molecules Side-View:
Writing/depositing charged molecules induced by appropriate substrate bias to transfer molecules through aperture opening

NANOLITHOGRAPHY METHODS AND PRODUCTS THEREFOR AND PRODUCED THEREBY

This application is a continuation of application Ser. No. 10/059,593, filed Jan. 28, 2002, which claims benefit of provisional application No. 60/264,550, filed Jan. 26, 2001, and is a continuation-in-part of application Ser. No. 09/477,997, filed Jan. 5, 2000, and a continuation-in-part of application Ser. No. 10/449,685, filed Jun. 2, 2003, which is a continuation of application Ser. No. 09/477,997, filed Jan. 5, 2000, which claims benefit of provisional application No. 60/115,133, filed Jan. 7, 1999 and provisional application No. 60/157,633, filed Oct. 4, 1999, the complete disclosures of which are incorporated herein by reference.

This invention was made with government support under grant(s) [F49620-96-1-0155] from [Air Force Office of Scientific Research]. The U.S. government has rights in the invention.

FIELD OF THE INVENTION

This invention relates to methods of nanolithography and products therefor and produced thereby.

BACKGROUND OF THE INVENTION

Lithographic methods are at the heart of modern day microfabrication, nanotechnology and molecular electronics. Microfabrication techniques such as photolithography, microcontact printing, micromachining, and microwriting can produce patterns as small as 100 nm, but the production of sub-100 nm structures still poses a challenge. Amro et al., *Langmuir,* 16, 3006-3009 (2000). At present, such high-resolution fabrication can be achieved using lithography techniques and a variety of scanning probe lithography (SPL) techniques have been developed for this purpose.

One such technique is dip pen nanolithograpy (DPN). See, e.g., Piner et al., *Science,* 283, 661-663 (1999); Hong et al., *Science,* 286, 523-528 (1999); Weinberger et al. *Advanced Materials,* 12, 1600-1603 (2000); and PCT application WO 00/41213. DPN is a nanolithography technique by which molecules are directly transported to a substrate of interest in a positive printing mode. DPN utilizes a solid substrate as the "paper" and a scanning probe microscope (SPM) tip (e.g., an atomic force microscope (AFM) tip or a near field scanning optical microscope (NSOM) tip) as the "pen." The tip is coated with a patterning compound (the "ink"), and the coated tip is used to apply the patterning compound to the substrate to produce a desired pattern. DPN enjoys numerous advantages for depositing "nanoscale" wide mono- or multi-layer molecules. The DPN delivery mechanism may involve the formation of a meniscus around the SPM tip and the control of the movement of the patterning molecules to the surfaces on which they are deposited by a driving force. Considerable recent work done in this area demonstrates the efficacy of the DPN approach to pattern monolayer molecules at the lateral width which is limited only by the liquid meniscus. DPN is described in pending application Ser. No. 09/477,997, filed Jan. 5, 2000, the complete disclosure of which is incorporated herein by reference.

Problems that arise with DPN technology stem from the dependence of the technique on the liquid meniscus. For example, the lateral width of the line written by the "pen" using DPN technology is limited by the width of the meniscus formed. The meniscus is subject to variations in the relative humidity as well as chemical interactions between the solvent and the substrate. The size of the meniscus also affects the rate of the transport of the patterning compound to the substrate. This may require coating of the microscope tip with hydrophobic compounds if the nanolithography is to be performed in air. Solubility characteristics of the "ink" molecules in a given solvent can create difficulty in establishing a desired line width and a suitable loading concentration of the ink in the solvent. Furthermore, surface tension characteristics of different solvents can lead to drip or rapid flow from the pen leading to problems with precise control of the ink application under some circumstances. Accordingly, additional and improved lithography techniques that could overcome these problems and extend the application to pattern with whiskers, clusters and nanocrystals as well as increased rates of deposition would be highly desirable for use in a variety of fields.

SUMMARY OF THE INVENTION

One aspect of the invention provides a method of Dip Pen Lithography (DPN) in which the movement of the molecules to be deposited or patterned on the substrate (the deposition compound or the patterning compound) from the tip to the substrate is controlled by a driving force. The driving force can be magnetic, chemical, electrical or another analogous driving force capable of exerting control over the movement of the deposition compounds. This control can provide the added advantage of greatly increasing the control over the rate of deposition of the deposition compounds from the tip to the substrate.

Another aspect of the present invention provides a method of nanolithography referred to herein as Aperture Pen Nanolithography (APN). This method comprises providing a substrate and a deposition compound in a cavity within a scanning probe microscope tip. The deposition compound is applied to the substrate using an electrical, magnetic, chemical or analogous driving force. The tip is used to hold a reservoir of the deposition compound and to restrict the transfer of the deposition compound to the substrate as governed by the applicable driving force. Following transfer from the tip to the substrate, the deposition compound attaches to the substrate.

Another aspect of the present invention provides a scanning probe microscope tip with an internal cavity that acts as the reservoir for the deposition compound and has an external opening through which the deposition compound can pass to transfer to the substrate. The external opening contains a size-restricted aperture such that a deposition compound cannot successfully transfer from within the tip to the substrate in the absence of the appropriate driving force. The driving force is supplied in the form of an electrical, magnetic, chemical or analogous force sufficient to move the molecules of the deposition compound to the substrate through the size-restricted aperture where they may interact, such as by chemically interacting, to become bound to the substrate.

In another aspect, the invention provides a nanolithography device having a scanning probe microscope tip with an internal cavity having an external opening containing a size- or shape-selective aperture. The aperture may be formed in a variety of materials such as a semi-permeable polymer gel or liquid suspension, an ultra thin membrane or an ultra thin crystal. The aperture controls the movement of molecules from within the cavity under an applicable driving force to the substrate.

DETAILED DESCRIPTION OF THE INVENTION

A. Dip Pen Nanolithography

Figure 1:
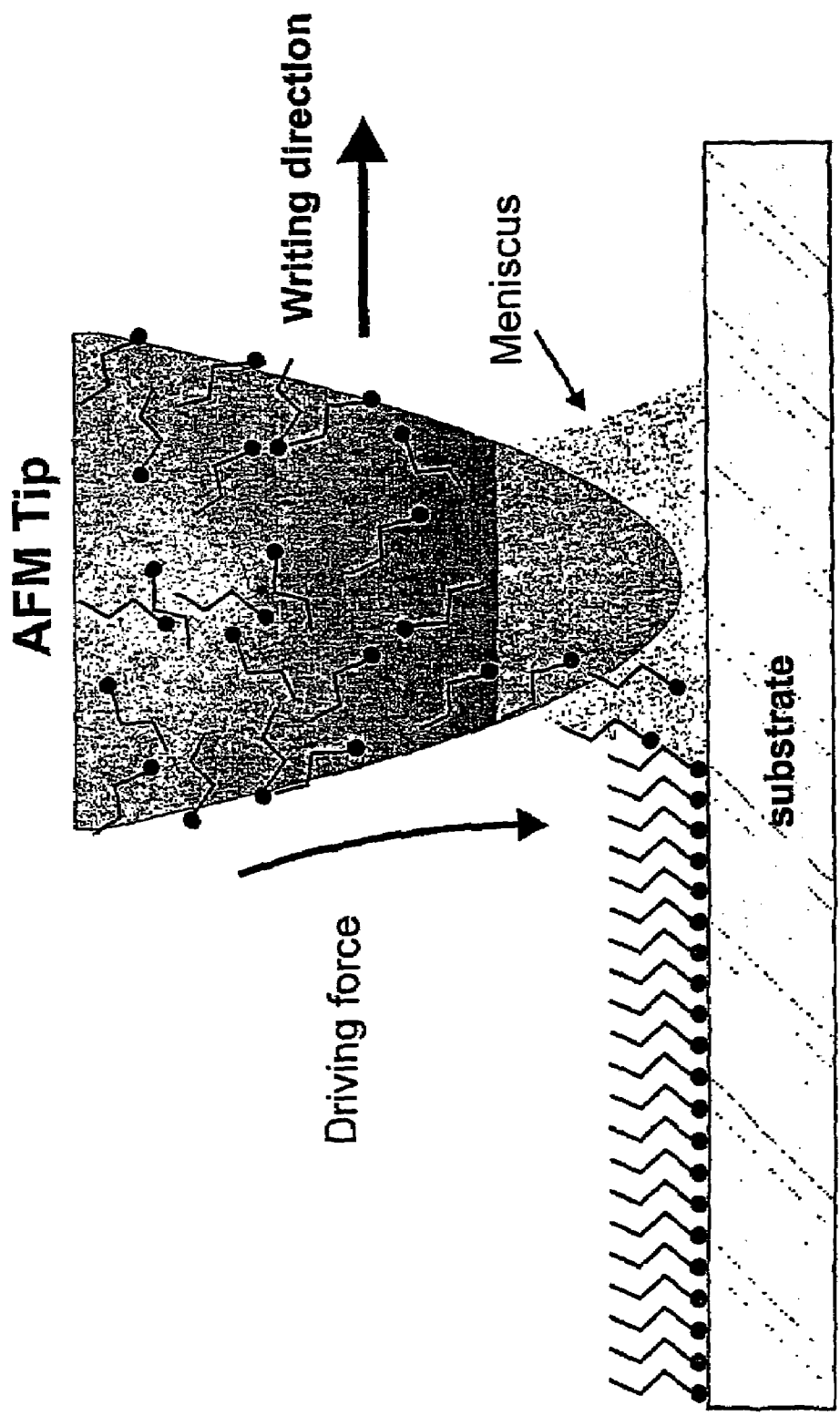
FIG. 1 shows a schematic representation of Dip Pen Nanolithography (DPN). The present invention uses a driving force to control the movement of the deposition compound from the AFM tip to the substrate.

The invention provides a method of nanolithogrphy for precisely patterning or depositing molecules on a substrate to form thin film nanostructures. The invention an improved method of DPN in which the rate and extent of the movement of the deposition compound from the tip to the substrate is controlled by a driving force.

To practice DPN, a scanning probe microscope (SPM) tip is coated with a patterning compound. This can be accomplished in a number of ways. For instance, the tip can be coated by vapor deposition, by direct contact scanning, or by bringing the tip into contact with a solution of the patterning compound.

The simplest method of coating the tips is by direct contact scanning. Coating by direct contact scanning is accomplished by depositing a drop of a saturated solution of the patterning compound on a solid substrate (e.g., glass or silicon nitride; available from Fisher Scientific or MEMS Technology Application Center). Upon drying, the patterning compound forms a microcrystalline phase on the substrate. To coat the patterning compound on the SPM tip, the tip is scanned repeatedly across this microcrystalline phase. While this method is simple, it does not lead to the best loading of the tip, since it is difficult to control the amount of patterning compound transferred from the substrate to the tip.

The tips can also be coated by vapor deposition. See Sherman, *Chemical Vapor Deposition For Microelectronics: Principles, Technology And Applications* (Noyes, Park Ridges, N.J., 1987. Briefly, a patterning compound (in pure form, solid or liquid, no solvent) is placed on a solid substrate (e.g., glass or silicon nitride; obtained from Fisher Scientific or MEMS Technology Application Center), and the tip is positioned near (within about 1-20 cm, depending on chamber design) the patterning compound. The compound is then heated to a temperature at which it vaporizes, thereby coating the tip with the compound. For instance, 1-octadecanethiol can be vapor deposited at 60° C. Coating by vapor deposition should be performed in a closed chamber to prevent contamination of other areas. If the patterning compound is one which is oxidized by air, the chamber should be a vacuum chamber or a nitrogen-filled chamber. Coating the tips by vapor deposition produces thin, uniform layers of patterning compounds on the tips and gives very reliable results in DPN.

Preferably, however, the SPM tip is coated by dipping the tip into a solution of the patterning compound. The solvent is not critical; all that is required is that the compound be in solution. However, the solvent is preferably the one in which the patterning compound is most soluble. Also, the solution is preferably a saturated solution. In addition, the solvent is preferably one that adheres to (wets) the tip (uncoated or coated with an adhesion layer) very well. The tip is maintained in contact with the solution of the patterning compound for a time sufficient for the compound to coat the tip. Such times can be determined empirically. Generally, from about 30 seconds to about 3 minutes is sufficient. Preferably, the tip is dipped in the solution multiple times, with the tip being dried between each dipping. The number of times a tip needs to be dipped in a chosen solution can be determined empirically. Preferably, the tip is dried by blowing an inert gas (such as carbon tetrafluoride, 1,2-dichloro-1,1,2,2,-tetrafluoroethane, dichlorodifluoromethane, octafluorocyclobutane, trichlorofluoromethane, difluoroethane, nitrogen, nitrogen, argon or dehumidified air) not containing any particles (i.e., purified) over the tip. Generally, about 10 seconds of blowing with the gas at room temperature is sufficient to dry the tip. After dipping (the single dipping or the last of multiple dippings), the tip may be used wet to pattern the substrate, or it may be dried (preferably as described above) before use. A dry tip gives a low, but stable, rate of transport of the patterning compound for a long time (on the order of weeks), whereas a wet tip gives a high rate of transport of the patterning compound for a short time (about 2-3 hours). A dry tip is preferred for compounds having a good rate of transport under dry conditions, whereas a wet tip is preferred for compounds having a low rate of transport under dry conditions.

To perform this embodiment of DPN under the control of a driving force, the coated tip is brought into close contact or into actual contact with a substrate. Thus, the tip is "in contact" with the substrate when it is close enough so that a meniscus forms. Alternatively, the tip may be held in close contact with the substrate but kept a suitable distance from the substrate such that the formation of a meniscus is prevented. The applicable driving force is then applied or modified to cause the deposition compound to move from the tip to the substrate. Suitable solvents, also referred to as transport media, include water, hydrocarbons (e.g., hexane), and solvents in which the patterning compounds are soluble. Faster writing with the tip can be accomplished by using the transport medium in which the patterning compound is most soluble. Ultimately, the rate at which the writing can be accomplished is controlled by the application of the driving force applied to the tip and/or substrate.

B. Aperture Pen Nanolithography

The invention also provides a method of nanolithography using a delivery device capable of controlled, site-specific delivery and deposition of size-selected molecules, whiskers, clusters and nanocrystals on substrate surfaces and methods of using the same. The device is a tip with an internal cavity having a narrow opening at the end allowing size or shape-restricted delivery of a deposition compound in the internal cavity onto the surface of the substrate. A variation of such tips using a cantilevered micropipette has been previously described by Lewis et al. (*Applied Physics Letters*, 75, 2689 (1999)s). The opening in the end of the tip is sufficiently small to create a capillary force preventing delivery of fluid through the narrow opening while the size- or shape-specific aperture limits transport of molecules or other entities to only those which can physically pass through the aperture opening under the driving force. Suitable tips include SPM tips modified to contain a reservoir with an external opening controlled by an aperture, and tips having similar properties, including tips made especially for APN using the guidelines provided herein. As used in this application, the phrases "scanning probe microscope tips" and "SPM tips" mean tips used in atomic scale imaging. Suitable SPM tips include AFM tips, near field scanning optical microscope (NSOM) tips, and scanning tunneling microscope (STM) tips. NSOM tips are hollow, and the deposition compounds are loaded in the hollows of the NSOM tips which serve as reservoirs of the deposition compound to produce a virtual fountain pen when combined with an appropriate aperture thereby forming an APN tip according to the present invention. Many suitable SPM tips are available commercially (e.g., from Park Scientific, Digital Instruments, Molecular Imaging, Thermomicroscopes, Digital Instruments Nanonics Ltd. and Topometrix). Alternatively, SPM tips can be made by methods well known in the art. For instance, SPM tips can be made by e-beam lithography. The APN tips may be made to include a nanotube. This embodiment may resemble a nanotube mounted tip. Preferably, the nanotube is a carbon nanotube. Most preferably, the tip is an AFM tip. Any AFM tip can be used, and suitable AFM tips include those that are available commercially from, e.g., Park Scientific, Digital Instruments and Molecular Imaging.

The aperture on the tip can be useful at any size sufficiently narrow to create a capillary force such that the deposition compound cannot run, drip or otherwise move from the tip to the substrate surface through the aperture without the application of a driving force sufficient to overcome the capillary force. Typically, an aperture with an internal diameter of less than 200 nm is sufficiently narrow. Preferably, the aperture has an internal diameter of between about 0.2 nm and about 200 nm, more preferably, the aperture has an internal diameter of between about 0.5 nm and about 50 nm, more preferably the aperture has an internal diameter of between about 1 nm and about 20 nm, even more preferably, aperture has an internal diameter of between about 2 nm and about 10 nm. The narrow aperture on the SPM tip of the present invention can be made by several means, for example focused ion beam, mechanical/ion polishing of narrow tip-cones or by high-energy electron beam induced "drilling" of ultra-thin membranes (e.g. 2-10 nm thick $SiO_2$, $Si_3N_4$ or amorphous carbon). Several materials undergo atomic sputtering under high-energy, high-intensity electron beam exposures. If such exposures are limited to small dimensions, as is the case with a focused electron probe on the specimen surface, the material under the electron beam can knock-off atoms, eventually creating holes of a size on the order of the electron beam diameter. Through MEMS technology, a microcontainer (e.g. AFM cantilever prism) can be created with ultra-thin membrane(s) at the bottom. This MEMS microcontainer can be loaded onto a TEM/STEM specimen holder for electron beam drilling experiments. A high energy (100-1000 keV) electron beam is then focused onto a small spot limited only by the narrowest electron beam size, which in modern TEMs/STEMs can be as small as 0.2-0.5 nm. Subsequent inelastic scattering and direct atomic sputtering by prolonged high-energy electron beam exposure results in local mass loss within the irradiated region. This eventually results in formation of nano-holes of a size on the order of the beam diameter. By selecting different shapes of the electron beam (e.g. circular, square etc.), differently shaped holes can be drilled. Alternatively, using appropriate crystallographic orientation of ultra-thin crystalline membranes, holes which conform to crystallography of the ultra-thin film may be formed. For example, oriented ultra-thin MgO may produce a square-shaped nanohole, while an oriented sapphire (single crystals of $Al_2O_3$) ultra-thin film will produce a hexagonal-shaped nanohole. Other crystalline membranes that are useful include, but are not limited to, diamond, and intermetalic or compound semiconductors, preferably type III-V semiconductors and type II-VI semiconductors. The deposition compound delivered through this external opening or aperture is then deposited on the substrate at a spatial resolution consistent with the aperture opening in the range of about 0.2 nm to about 100 nm.

APN tips can be loaded with the deposition compound in a variety of ways. When the internal cavity is to be loaded with a solution of the deposition compound the solution, preferably a saturated solution, is injected or otherwise transported into the cavity. This loading can also be done by soaking the tip in the appropriate deposition compound solution. Similar to DPN tips, the APN tips can also be loaded by vapor deposition, by direct contact scanning, or by bringing the tip into contact with a solution of the patterning compound.

C. Driving Forces

The present invention involves the use of electrical, magnetic, chemical or analogous driving forces to transfer molecules, whiskers, clusters or nanocrystals from the tip to the substrate. The driving force causes the physical movement of the deposition compound from the tip to the substrate. This greatly increases the control over the movement of the deposition compound making it possible to create size-selective and site-specific coverage of individual molecules and precisely formed thin film nanostructures. Additionally, the driving force can be used to control the rate of deposition making it possible to decrease or increase the speed with which the deposition compound moves from the DPN or APN tips to the substrate. In one embodiment of the present invention the driving force is used to control movement of the deposition compound from a DPN tip to the substrate. In this embodiment, the DPN tip has the deposition compound loaded on the surface of the tip and may include an appropriate solvent. The DPN tip is then moved into close proximity of the substrate or moved to make contact with the substrate. The deposition compound is then moved from the tip to the substrate by either applying or changing the appropriate driving force. For example, if the deposition compound is a magnetic compound such as nickel or iron or a magnetically tagged compound, the appropriate driving force may be a magnetic field of a larger magnitude applied to the substrate. Alternatively, the magnetic filed may be reversed between the tip and the substrate causing a magnetic deposition compound to move away from the tip to the substrate. As another example, the deposition compound may be a negatively or positively charged compound and the appropriate driving force may be an electrical driving force. The electricity may then be precisely controlled and applied to the substrate, to the tip or to both the substrate and the tip to control the movement of deposition compounds from the tip to the substrate. Alternatively, the electricity may be continuously present in either the tip or the substrate or both and the movement of the deposition compound to the substrate may be precisely controlled by modulation of the electrical current already present. This embodiment makes it possible to modulate the rate of deposition or patterning by control over the applicable driving force.

Figure 2:
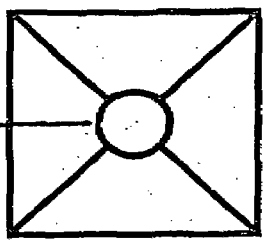
FIG. 2A shows the top view enlargement of a fabricated microcontainer of the present invention.
FIG. 2B shows a side view enlargement of the microcontainer of FIG. 1A.
FIG. 2C shows a side view enlargement of the microcontainer of the present invention suspended in liquid containing a deposition compound.
Figure 2:
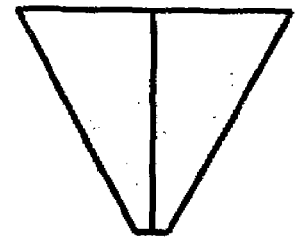
Figure 2:
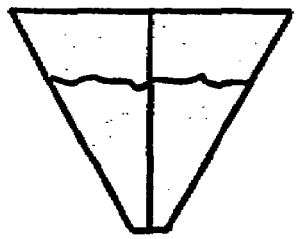
Figure 3:
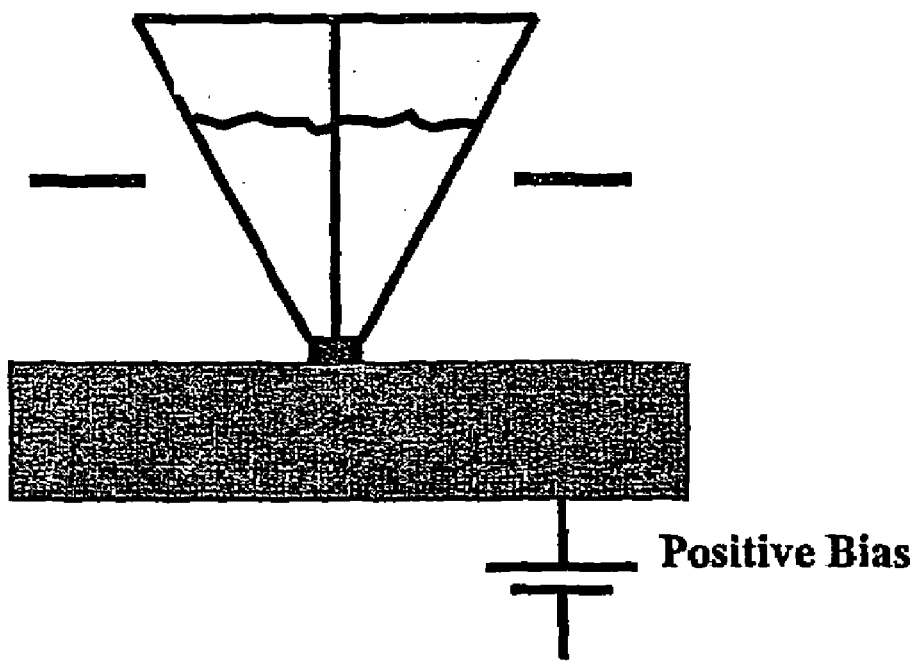
FIG. 3 is a schematic of a microcontainer of the present invention loaded with deposition compound for delivery through the aperture at the tip of the microcontainer to the substrate under an electrical driving force.

In another embodiment of the present invention the driving force is used to control movement of the deposition compound from the APN tip to the substrate through well-defined and size-selective apertures fabricated by a variety of mechanisms for nanoscale to sub-nanometer (nm) scale features. In this way, the cross-section of the aperture can be formed to be consistent with the cross-section geometry of the molecule or materials that are to be transported through the aperture, similar to sieving coins or shape-specific objects. In this embodiment, the driving force is applied to overcome the limitation of capillary action which precludes delivery of the deposition compound through the narrow opening defined by the capillary forces, while the size-specific aperture limits transport of molecules or other entities to only those which can physically pass through the aperture opening. For example, gel electrophoresis is a well-know and widely-used technique to separate DNA molecules based on size/mass. This technique relies on the transport of negatively-charged DNA molecules through the nanoscale pores of polymeric gels under the influence of an electrical field across the gel. A novel approach to deposit/pattern single or multiple DNA molecules on a substrate involves a reservoir containing DNA molecules, for instance in an AFM cantilever prism (see FIG. 2), having a narrow opening with a diameter of between about 2 nm and about 15 nm at the end. At this diameter, the viscosity and capillary effects dominate and do not permit "dripping" of the liquid through such narrow opening. However, when the tip is closely approached by a positively-biased substrate (e.g. gold), the negatively-charged DNA is attracted to the positively-charged substrate, analogous to gel electrophoresis. This allows the transfer of DNA molecules directly onto the substrate. If the DNAs are "thiolated," the thiol groups bond to the gold surface creating a monolayer coverage of single DNA molecules wherever the AFM tip is brought close enough to the positively-biased substrate surface. If the aperture of the AFM opening is made small enough, as for example, the diameter of single DNA strand, only one DNA strand is transferred through the aperture onto the substrate, allowing, for the first time, size-selective and site-specific coverage and patterning with single molecules.

Thus, by creating a stimulus for transport of charged molecules via substrate bias and by controlling the aperture opening by size- and shape-specific method, a variety of molecules are transferred onto an active substrate. The stimulus may be electrical bias of the substrate (for example to transport charged molecules such as DNA) or magnetic (to transport magnetically active molecules) or chemical (to exploit chemical interactions to control movement of deposition compounds). The chemical interaction may be a natural chemical interaction that takes place between the deposition compound and the substrate or molecules affixed to the surface of the substrate. The chemical interaction may also arise between a deposition compound or a chemical on the surface of the substrate modified or tagged with a chemical such that a chemical interaction can take place between the substrate and the deposition compound. The chemical interaction will typically be a chemical attraction between the deposition compound and the substrate and the modification of this chemical attraction can be used to control the extent and the rate of the movement of the deposition compound from the tip to the substrate. For example, the driving force may be a chemical driving force created by a substrate having a chemical attraction to the deposition compound. Further, by fabricating the aperture opening of the APN tip to size and shape specificity, the transfer can be extended to include other structures such as whiskers (nanowires), clusters (e.g. proteins) and nanoparticles (e.g. magnetic or electrostatically charged). The aperture may be fabricated to include specific shapes such as circles, squares, triangles, elipses, or other polygons.

D. Coated Tips

When an atomic force microscope is operated in air, water condenses between the tip and surface to form a meniscus and then is transported by means of the meniscus as the tip is scanned across the surface. This filled meniscus, and the capillary force associated with it, significantly impede the operation of the APN and substantially affect the imaging process.

Quite surprisingly, it has been found that AFM tips coated with certain hydrophobic compounds exhibit an improved ability to image substrates in air by AFM as compared to uncoated tips. The reason for this is that the hydrophobic molecules reduce the size of the water meniscus formed and effectively reduce friction. As a consequence, the resolution of AFM in air is increased using a coated tip, as compared to using an uncoated tip. Accordingly, coating tips with the hydrophobic molecules can be utilized as a general pretreatment for both DPN and APN tips for performing DPN and/or APN in air or in circumstances when it is important to prevent formation of a meniscus between the tip and the substrate.

Hydrophobic compounds useful for coating AFM tips must form a uniform thin coating on the tip surface, must not bind covalently to the substrate being imaged or to the tip, must bind to the tip more strongly than to the substrate, and must stay solid at the temperature of AFM operation. Suitable hydrophobic compounds include those hydrophobic compounds described above for use as deposition compounds, provided that such hydrophobic deposition compounds are not used to coat AFM tips which are used to image a corresponding substrate for the deposition compound or to coat AFM tips which are made of, or coated with, materials useful as the corresponding substrate for the deposition compound. Preferred hydrophobic compounds for most substrates are those having the formula $RNH_2$, wherein R is an alkyl of the formula $CH_3(CH_2)_n$ or an aryl, and n is 0-30, preferably 10-20 (see discussion of deposition compounds above). Particularly preferred is 1-dodecylamine for AFM temperatures of operation below 74° F. (about 23.3° C.).

The tips may also be coated with a hydrophilic compound for use in certain applications. For example the tip may be coated with compounds that interact chemically with the deposition compound or the substrate. This may require the use of chemical coatings on the tips that are hydrophilic in nature.

AFM tips can be coated with the hydrophobic or hydrophilic compounds in a variety of ways. Suitable methods include those described above for coating AFM tips with patterning compounds for use in DPN. Preferably, the AFM tip is coated with a hydrophobic compound by simply dipping the tip into a solution of the compound for a sufficient time to coat the tip and then drying the coated tip with an inert gas, either after formation of the aperture if the aperture materials and the treatment is compatible or before aperture formation if the aperture is deleteriously affected by the treatments. After the tip is coated, APN is performed in the same manner as it would be if the tip were not coated. No changes in APN procedures have been found necessary.

The tip in APN is used to form a desired pattern or to provide size-selective, site-specific coverage with single molecules of the deposition compound on the substrate. The pattern may be any pattern and may be simple or complex. For instance, the pattern may be a dot, a line, a cross, a geometric shape (e.g., a triangle, square or circle), combinations of two or more of the foregoing, arrays (e.g., a square array of rows and columns of dots), electronic circuits, or part of, or a step in, the formation of three-dimensional structures, whiskers, clusters, nanocrystals and even single molecules.

E. The Substrate

The substrate may be of any shape and size. In particular, the substrate may be flat or curved. Substrates may be made of any material which can be modified by a deposition compound to form stable surface structures and can be subjected to electrical, magnetic, chemical or analogous forces to create the driving force for movement of the deposition compound from the tip to the substrate. Substrates useful in the practice of the invention include metals (e.g., gold, silver, aluminum, copper, platinum, and paladium), metal oxides (e.g., oxides of Al, Ti, Fe, Ag, Zn, Zr, In, Sn and Cu), semiconductor materials (e.g., Si, CdSe, CdS and CdS coated with ZnS), magnetic materials (e.g., ferromagnetite), polymers or polymer-coated substrates, superconductor materials ($YBa_2Cu_3O_{7-\delta}$), Si, $SiO_2$, glass, AgI, AgBr, $HgI_2$, PbS, PbSe, ZnSe, ZnS, ZnTe, CdTe, InP, $In_2O_3/SnO_2$, $In_2S_3$, $In_2Se_3$, $In_2Te_3$, $Cd_3P_2$, $Cd_3As_2$, InAs, AlAs, GaP, GaAs, and indium tin oxide. Methods of making such substrates are well-known in the art and include evaporation and sputtering (metal films), crystal semiconductor growth (e.g., Si, Ge, GaAs), chemical vapor deposition (semiconductor thin films), epitaxial growth (crystalline semiconductor thin films), and thermal shrinkage (oriented polymers). See, e.g., Alcock et al., *Canadian Metallurgical Quarterly,* 23, 309 (1984); Holland, *Vacuum Deposition of Thin Films* (Wiley, New York 1956); Grove, *Philos. Trans. Faraday Soc.,* 87 (1852); Teal, *IEEE Trans. Electron Dev.* ED-23, 621 (1976); Sell, *Key Eng. Materials,* 58, 169 (1991); Keller et al., *Float-Zone Silicon* (Marcel Dekker, New York, 1981); Sherman, *Chemical Vapor Deposition For Microelectronics: Principles, Technology And Applications* (Noyes, Park Ridges, N.J., 1987); *Epitaxial Silicon Technology* (Baliga, ed., Academic Press, Orlando, Fla., 1986); U.S. Pat. No. 5,138,174; Hidber et al., *Langmuir,* 12, 5209-5215 (1996). Suitable substrates can also be obtained commercially from, e.g., Digital Instruments (gold), Molecular Imaging (gold), Park Scientific (gold), Electronic Materials, Inc. (semiconductor wafers), Silicon Quest, Inc. (semiconductor wafers), MEMS Technology Applications Center, Inc. (semiconductor wafers), Crystal Specialties, Inc. (semiconductor wafers), Siltronix, Switzerland (silicon wafers), Aleene's, Buellton, Calif. (biaxially-oriented polystyrene sheets), and Kama Corp., Hazelton, Pa. (oriented thin films of polystyrene). Gold substrates are preferred.

F. Deposition Compounds

Any deposition compound can be used, provided it is capable of transferring to the substrate, under the influence of a driving force, to modify the substrate to form stable surface structures. Stable surface structures are formed by chemisorption or physisorption of the molecules of the deposition compound onto the substrate or by covalent linkage of the molecules of the deposition compound to the substrate. Useful compounds include magnetic particles or biomolecules such as proteins, peptides, polypeptides, nucleotides, polynucleotides, nucleic acids and synthetic organic compounds. Additionally, biomolecules bound, adsorbed or absorbed to magnetic particles are particularly useful.

Many suitable compounds which can be used as the deposition compound, and the corresponding substrate(s) for the compounds, are known in the art. For example:

a. Compounds of the formula $R_1SH$, $R_1SSR_2$, $R_1SR_2$, $R_1SO_2H$, $(R_1)_3P$, $R_1NC$, $R_1CN$, $(R_1)_3N$, $R_1COOH$, or ArSH can be used to pattern gold substrates;

b. Compounds of formula $R_1SH$, $(R_1)_3N$, or ArSH can be used to pattern silver, copper, palladium and semiconductor substrates;

c. Compounds of the formula $R_1NC$, $R_1SH$, $R_1SSR_2$, or $R_1SR_2$ can be used to pattern platinum substrates;

d. Compounds of the formula $R_1SH$ can be used to pattern aluminum, $TiO_2$, $SiO_2$, GaAs and InP substrates;

e. Organosilanes, including compounds of the formula $R_1SiCl_3$, $R_1Si(OR_2)_3$, $(R_1COO)_2$, $R_1CH=CH_2$, $R_1Li$ or $R_1MgX$, can be used to pattern Si, $SiO_2$ and glass substrates;

f. Compounds of the formula $R_1COOH$ or $R_1CONHR_2$ can be used to pattern metal oxide substrates;

g. Compounds of the formula $R_1SH$, $R_1NH_2$, $ArNH_2$, pyrrole, or pyrrole derivatives wherein $R_1$ is attached to one of the carbons of the pyrrole ring, can be used to pattern cuprate high temperature superconductors;

h. Compounds of the formula $R_1PO_3H_2$ can be used to pattern $ZrO_2$ and $In_2O_3/SnO_2$ substrates;

i. Compounds of the formula $R_1COOH$ can be used to pattern aluminum, copper, silicon and platinum substrates;

j. Compounds that are unsaturated, such as azoalkanes ($R_3NNR_3$) and isothiocyanates ($R_3NCS$), can be used to pattern silicon substrates;

k. Proteins and peptides can be used to pattern, gold, silver, glass, silicon, and polystyrene; and l. Silazanes can be used to pattern $SiO_2$ and oxidized GaAs.

In the above formulas:

$R_1$ and $R_2$ each has the formula $X(CH_2)_n$ and, if a compound is substituted with both $R_1$ and $R_2$, then $R_1$ and $R_2$ can be the same or different;

$R_3$ has the formula $CH_3(CH_2)_n$;

n is 0-30;

Ar is an aryl;

X is $-CH_3$, $-CHCH_3$, $-COOH$, $-CO_2(CH_2)_mCH_3$, $-OH$, $-CH_2OH$, ethylene glycol, hexa(ethylene glycol), $-O(CH_2)_mCH_3$, $-NH_2$, $-NH(CH_2)_mNH_2$, halogen, glucose, maltose, fullerene C60, a nucleotide, an oligonucleotide, a nucleic acid (DNA, RNA, etc.), a protein (e.g., an antibody or enzyme) or a ligand (e.g., an antigen, enzyme substrate or receptor); and m is 0-30.

For a description of deposition compounds and their preparation and use, see Xia and Whitesides, *Angew. Chem. Int. Ed.,* 37, 550-575 (1998) and references cited therein; Bishop et al., *Curr. Opinion Colloid & Interface Sci.,* 1, 127-136 (1996); Calvert, *J. Vac. Sci. Technol.* B, 11, 2155-2163 (1993); Ulman, *Chem. Rev.,* 96:1533 (1996) (alkanethiols on gold); Dubois et al., *Annu. Rev. Phys. Chem.,* 43:437 (1992) (alkanethiols on gold); Ulman, *An Introduction to Ultrathin Organic Films: From Langmuir-Blodgett to Self-Assembly* (Academic, Boston, 1991) (alkanethiols on gold); Whitesides, *Proceedings of the Robert A. Welch Foundation 39th Conference On Chemical Research Nanophase Chemistry,* Houston, Tex., pages 109-121 (1995) (alkanethiols attached to gold); Mucic et al. *Chem. Commun.* 555-557 (1996) (describes a method of attaching 3' thiol DNA to gold surfaces); U.S. Pat. No. 5,472,881 (binding of oligonucleotide-phosphorothiolates to gold surfaces); Burwell, *Chemical Technology,* 4, 370-377 (1974) and Matteucci and Caruthers, *J. Am. Chem. Soc.,* 103, 3185-3191 (1981) (binding of oligonucleotides-alkylsiloxanes to silica and glass surfaces); Grabar et al., *Anal. Chem.,* 67, 735-743 (binding of aminoalkylsiloxanes and for similar binding of mercaptoalkylsiloxanes); Nuzzo et al., *J. Am. Chem. Soc.,* 109, 2358 (1987) (disulfides on gold); Allara and Nuzzo, *Langmuir,* 1, 45 (1985) (carboxylic acids on aluminum); Allara and Tompkins, *J. Colloid Interface Sci.,* 49, 410-421 (1974) (carboxylic acids on copper); Iler, *The Chemistry Of Silica,* Chapter 6, (Wiley 1979) (carboxylic acids on silica); Timmons and Zisman, *J. Phys. Chem.,* 69, 984-990 (1965) (carboxylic acids on platinum); Soriaga and Hubbard, *J. Am. Chem. Soc.,* 104, 3937 (1982)

(aromatic ring compounds on platinum); Hubbard, *Acc. Chem. Res.*, 13, 177 (1980) (sulfolanes, sulfoxides and other functionalized solvents on platinum); Hickman et al., *J. Am. Chem. Soc.*, 111, 7271 (1989) (isonitriles on platinum); Maoz and Sagiv, *Langmuir*, 3, 1045 (1987) (silanes on silica); Maoz and Sagiv, *Langmuir*, 3, 1034 (1987) (silanes on silica); Wasserman et al., *Langmuir*, 5, 1074 (1989) (silanes on silica); Eltekova and Eltekov, *Langmuir*, 3, 951 (1987) (aromatic carboxylic acids, aldehydes, alcohols and methoxy groups on titanium dioxide and silica); and Lec et al., *J. Phys. Chem.*, 92, 2597 (1988) (rigid phosphates on metals); Lo et al., *J. Am. Chem. Soc.*, 118, 11295-11296 (1996) (attachment of pyrroles to superconductors); Chen et al., *J. Am. Chem. Soc.*, 117, 6374-5 (1995) (attachment of amines and thiols to superconductors); Chen et al., *Langmuir*, 12, 2622-2624 (1996) (attachment of thiols to superconductors); McDevitt et al., U.S. Pat. No. 5,846,909 (attachment of amines and thiols to superconductors); Xu et al., *Langmuir*, 14, 6505-6511 (1998) (attachment of amines to superconductors); Mirkin et al., *Adv. Mater.* (Weinheim, Ger.), 9, 167-173 (1997) (attachment of amines to superconductors); Hovis et al., *J. Phys. Chem. B*, 102, 6873-6879 (1998) (attachment of olefins and dienes to silicon); Hovis et al., *Surf Sci.*, 402-404, 1-7 (1998) (attachment of olefins and dienes to silicon); Hovis et al., *J. Phys. Chem. B*, 101, 9581-9585 (1997) (attachment of olefins and dienes to silicon); Hamers et al., *J. Phys. Chem. B*, 101, 1489-1492 (1997) (attachment of olefins and dienes to silicon); Hamers et al., U.S. Pat. No. 5,908,692 (attachment of olefins and dienes to silicon); Ellison et al., *J. Phys. Chem. B*, 103, 6243-6251 (1999) (attachment of isothiocyanates to silicon); Ellison et al., *J. Phys. Chem. B*, 102, 8510-8518 (1998) (attachment of azoalkanes to silicon); Ohno et al., *Mol. Cryst. Liq. Cryst. Sci. Technol.*, Sect. A, 295, 487-490 (1997) (attachment of thiols to GaAs); Reuter et al., *Mater. Res. Soc. Symp. Proc.*, 380, 119-24 (1995) (attachment of thiols to GaAs); Bain, *Adv. Mater.* (Weinheim, Fed. Repub. Ger.), 4, 591-4 (1992) (attachment of thiols to GaAs); Sheen et al., *J. Am. Chem. Soc.*, 114, 1514-15 (1992) (attachment of thiols to GaAs); Nakagawa et al., *Jpn. J. Appl. Phys.*, Part 1, 30, 3759-62 (1991) (attachment of thiols to GaAs); Lunt et al., *J. Appl. Phys.*, 70, 7449-67 (1991) (attachment of thiols to GaAs); Lunt et al., *J. Vac. Sci. Technol., B*, 9, 2333-6 (1991) (attachment of thiols to GaAs); Yamamoto et al., *Langmuir* ACS ASAP, web release number Ia990467r (attachment of thiols to InP); Gu et al., *J. Phys. Chem. B*, 102, 9015-9028 (1998) (attachment of thiols to IP); Menzel et al., *Adv. Mater. (Weinheim, Ger.)*, 11, 131-134 (1999) (attachment of disulfides to gold); Yonezawa et al., *Chem. Mater.*, 11, 33-35 (1999) (attachment of disulfides to gold); Porter et al., *Langmuir*, 14, 7378-7386 (1998) (attachment of disulfides to gold); Son et al., *J. Phys. Chem.*, 98, 8488-93 (1994) (attachment of nitriles to gold and silver); Steiner et al., *Langmuir*, 8, 2771-7 (1992) (attachment of nitrites to gold and copper); Solomun et al., *J. Phys. Chem.*, 95, 10041-9 (1991) (attachment of nitrites to gold); Solomun et al., *Ber. Bunsen-Ges. Phys. Chem.*, 95, 95-8 (1991) (attachment of nitrites to gold); Henderson et al., *Inorg. Chim. Acta*, 242, 115-24 (1996) (attachment of isonitriles to gold); Huc et al., *J. Phys. Chem. B*, 103, 10489-10495 (1999) (attachment of isonitriles to gold); Hickman et al., *Langmuir*, 8, 357-9 (1992) (attachment of isonitriles to platinum); Steiner et al., *Langmuir*, 8, 90-4 (1992) (attachment of amines and phospines to gold and attachment of amines to copper); Mayya et al., *J. Phys. Chem. B*, 101, 9790-9793 (1997) (attachment of amines to gold and silver); Chen et al., *Langmuir*, 15, 1075-1082 (1999) (attachment of carboxylates to gold); Tao, J. Am. Chem. Soc., 115, 4350-4358 (1993) (attachment of carboxylates to copper and silver); Laibinis et al., *J. Am. Chem. Soc.*, 114, 1990-5 (1992) (attachment of thiols to silver and copper); Laibinis et al., *Langmuir*, 7, 3167-73 (1991) (attachment of thiols to silver); Fenter et al., *Langmuir*, 7, 2013-16 (1991) (attachment of thiols to silver); Chang et al., *Am. Chem. Soc.*, 116, 6792-805 (1994) (attachment of thiols to silver); Li et al., *J. Phys. Chem.*, 98, 11751-5 (1994) (attachment of thiols to silver); Li et al., *Report*, 24 pp (1994) (attachment of thiols to silver); Tarlov et al., U.S. Pat. No. 5,942,397 (attachment of thiols to silver and copper); Waldeck, et al., PCT application WO/99/48682 (attachment of thiols to silver and copper); Gui et al., *Langmuir*, 7, 955-63 (1991) (attachment of thiols to silver); Walczak et al., *J. Am. Chem. Soc.*, 113, 2370-8 (1991) (attachment of thiols to silver); Sangiorgi et al., *Gazz. Chim. Ital.*, 111, 99-102 (1981) (attachment of amines to copper); Magallon et al., *Book of Abstracts, 215th ACS National Meeting, Dallas, Mar. 29-Apr. 2*, 1998, COLL-048 (attachment of amines to copper); Patil et al., *Langmuir*, 14, 2707-2711 (1998) (attachment of amines to silver); Sastry et al., *J. Phys. Chem. B*, 101, 4954-4958 (1997) (attachment of amines to silver); Bansal et al., *J. Phys. Chem. B*, 102, 4058-4060 (1998) (attachment of alkyl lithium to silicon); Bansal et al., *J. Phys. Chem. B*, 102, 1067-1070 (1998) (attachment of alkyl lithium to silicon); Chidsey, *Book of Abstracts, 214th ACS National Meeting, Las Vegas, Nev., Sep. 7-11*, 1997, I&EC-027 (attachment of alkyl lithium to silicon); Song, J. H., Thesis, University of California at San Diego (1998) (attachment of alkyl lithium to silicon dioxide); Meyer et al., *J. Am. Chem. Soc.*, 110, 4914-18 (1988) (attachment of amines to semiconductors); Brazdil et al. *J. Phys. Chem.*, 85, 1005-14 (1981) (attachment of amines to semiconductors); James et al., *Langmuir*, 14, 741-744 (1998) (attachment of proteins and peptides to glass); Bernard et al., *Langmuir*, 14, 2225-2229 (1998) (attachment of proteins to glass, polystyrene, gold, silver and silicon wafers).

G. Multiple Tip Nanolithography

Single tips can be used to produce one or more patterns of a deposition compound on a substrate. Alternatively, a plurality of tips can be used in a single or similar device to produce a plurality of patterns (the same pattern or different patterns) on the substrate (see, e.g., U.S. Pat. Nos. 5,630,923, and 5,666,190, Lutwyche et al., *Sens. Actuators A*, 73:89 (1999), Vettiger et al., *Microelectron Eng.*, 46:11 (1999), Minne et al., *Appl. Phys. Lett.*, 73:1742 (1998), and Tsukamoto et al., *Rev. Sci. Instrum.*, 62:1767 (1991) which describe devices comprising multiple cantilevers and tips for patterning a substrate). When a plurality of tips is used, the tips can be used serially or in parallel to produce patterns on the substrate.

If patterns of more than one deposition compound overlapping on the substrate are desired, any unbound first deposition compound must be removed from the substrate before applying a second deposition compound. The unbound first deposition compound can be removed by rinsing the substrate. Any solvent or solution and conditions may be used that are not harmful to the deposition compound attached to the substrate. After removal of the unbound first deposition compound, a second deposition compound is applied to at least a portion of the substrate. The second deposition compound is applied in the same manner as described above. A desired pattern of the second deposition compound on the substrate is produced in the same manner as described above using one or a plurality of tips substantially free of the first deposition compound. A tip substantially free of the first deposition compound can be a new tip or it can be the tip used to apply the first deposition compound which has been cleaned to remove the first deposition compound. The cleaning of tips can be accomplished by rinsing them in a solvent in which the deposition compound is soluble (e.g., by simply dipping the tips in the solvent). The solvent is preferably the solvent in which the deposition compound is most soluble. These steps can be repeated as many times as necessary to pattern the substrate with as many different deposition compounds as desired.

H. Multiple Deposition Compounds

More than one deposition compound can be used to pattern a substrate simultaneously by applying each of the deposition compounds to the substrate from a plurality of tips. Each of the deposition compounds applied to the substrate by the tips covers only a specific controlled area dictated by the tip used to apply it. Thus, the plurality of tips are spaced sufficiently apart and the size of the deposition compound structures must be tailored so that there is no overlap of the different deposition compounds after they are applied. Of course, the plurality of tips could also be used to produce a plurality of patterns (the same pattern or different patterns) of that deposition compound.

I. Patterns

DPN and APN can be used to prepare arrays, including combinatorial arrays. An "array" is an arrangement of a plurality of discrete sample areas in a pattern on a substrate. The sample areas may be any shape (e.g., dots, circles, squares or triangles) and may be arranged in any pattern (e.g., rows and columns of discrete sample areas). Each sample area may contain the same or a different sample as contained in the other sample areas of the array. A "combinatorial array" is an array wherein each sample area or a small group of replicate sample areas (usually 2-4) contain(s) a sample which is different than that found in other sample areas of the array. A "sample" is a material or combination of materials to be studied, identified, reacted, etc.

This technique will be particularly useful for the preparation of arrays on the submicrometer scale. An "array on the submicrometer scale" means that at least one of the dimensions (e.g. length, width or diameter) of the sample areas, excluding the depth, is less than 1 μm. At present, the technique can be used to prepare lines that are about 2 to about 10 nm in width. Arrays on a submicrometer scale allow for faster reaction times and the use of less reagents than the currently-used microscale (i.e., having dimensions, other than depth, which are 1-999 μm) and larger arrays. Also, more information can be gained per unit area (i.e., the arrays are more dense than the currently-used micrometer scale arrays). Finally, the use of submicrometer arrays provides new opportunities for screening. For instance, such arrays can be screened with scanning probe microscopes to look for physical changes in the patterns (e.g., shape, stickiness, height) and/or to identify chemicals present in the sample areas, including sequencing of nucleic acids.

Each sample area of an array contains a single sample. For instance, the sample may be a biological material, such as a nucleic acid (e.g., an oligonucleotide, DNA, or RNA), protein or peptide (e.g., an antibody or an enzyme), ligand (e.g., an antigen, enzyme substrate, receptor or the ligand for a receptor), or a combination or mixture of biological materials (e.g., a mixture of proteins). Such materials may be attached directly on a desired substrate or each sample area may contain a compound attached for capturing the biological material. See, e.g., PCT applications WO 00/04382, WO 00/04389 and WO 00/04390, the complete disclosures of which are incorporated herein by reference. For instance, deposition compounds terminating in certain functional groups (e.g., —COOH) can bind proteins through a functional group present on, or added to, the protein (e.g., —NH$_2$). Also, it has been reported that polylysine, which can be attached to the substrate as described above, promotes the binding of cells to substrates. See James et al., *Langmuir*, 14, 741-744 (1998). It has further been reported that cells bind to octadecanethiol-coated surfaces. As another example, each sample area may contain a chemical compound (organic, inorganic and composite materials) or a mixture of chemical compounds. Chemical compounds may be deposited directly on the substrate or may be attached through a functional group present on a deposition compound present in the sample area. From the foregoing, those skilled in the art will recognize that a deposition compound may comprise a sample or may be used to capture a sample.

Arrays and methods of using them are known in the art. For instance, such arrays can be used for biological and chemical screenings to identify and/or quantify a biological or chemical material (e.g., immunoassays, enzyme activity assays, genomics, and proteomics). Biological and chemical libraries of naturally-occurring or synthetic compounds and other materials, including cells, can be used, e.g., to identify and design or refine drug candidates, enzyme inhibitors, ligands for receptors, and receptors for ligands, and in genomics and proteomics. References describing combinatorial arrays and other arrays and their uses include U.S. Pat. Nos. 5,747,334, 5,962,736, and 5,985,356, and PCT applications WO 96/31625, WO 99/31267, WO 00/04382, WO 00/04389, WO 00/04390, WO 00/36136, and WO 00/46406.

DPN and APN can also be used in the preparation of three-dimensional structures. For instance, the technique can be used to produce one or more patterns of one or more deposition compounds on a substrate. The first layer of compounds on the substrate will be referred to as the foundation layer. It will also be appreciated that the foundation layer could be prepared by conventional nanografting. See Xu and Liu, *Langmuir*, 13, 127-129 (1997) and U.S. Pat. No. 5,922, 214. After the foundation layer is completed, structure-forming compounds are added to the foundation layer to form the three-dimensional structure. The three-dimensional structure may be simple (e.g., addition of one structure-forming compound to add a single desired feature or property to the foundation layer) or complex (e.g., addition of many structure-forming compounds to add multiple features and/or properties and/or to form multiple layers). Three-dimensional structures may be any micro- or nano-scale device, system, material, etc., and the term "three-dimensional structure" is used herein to distinguish such structures from those micro- or nano-scale devices, systems, materials, etc. produced by applying the deposition compounds to the substrate by high force nanolithography or nanografting (i.e., those structures comprised only of the foundation layer).

A structure-forming compound may be any compound that reacts chemically or otherwise stably combines (e.g., by hybridization of two complimentary strands of nucleic acid) with the deposition compound(s). The structure-forming compound may be one of the deposition compounds described above or a functionalized deposition compound. By "functionalized" is meant that the deposition compound has been altered chemically (e.g., a carboxylate group has been reacted with an alcohol to produce an ester or has been reacted with an amino acid to produce a peptide linkage, etc.) or has a physical material (e.g., a nanoparticle) attached to it. The structure-forming compound may also be a compound that functionalizes, e.g., a particular deposition compound (e.g., converting a carboxylate group on deposition compounds to interchain anhydride groups or converting an azide group on the deposition compound to an amino group), a compound (e.g., a chemical or biological molecule) that has been functionalized to bind to a capture compound (i.e., a compound designed to capture chemical, biological molecules or other materials). For examples of structure-forming compounds, see Dubois and Nuzzo, *Annu. Rev. Phys. Chem.*, 43, 437-63 (1992); Muller et al., *Science*, 268, 272 (1995); Bishop and Nuzzo, *Current Opinion in Colloid & Interface Science*, 1, 127-136 (1996); Yan et al., *J. Am. Chem. Soc.*, 120, 6179-6180 (1998); Yan et al., *Langmuir*, 15, 1208-1214 (1999); Lahiri et al., *Langmuir*, 15, 2055-2060 (1999); and Huck et al., *Langmuir*, 15, 6862-6867 (1999); PCT applications WO 00/04389, 00/04382, 00/04390; and PCT applications WO 98/04740, 01/00876 and 01/51665 (oligonucleotides functionalized with nanoparticles and other particles and their use for detection of nucleic acids and to prepare various nanostructures and nanomaterials). In a particularly preferred embodiment, at least one of the deposition compounds and at least one of the structure-forming compounds comprise nucleic acids (e.g., oligonucleotides), and the three-dimensional structure is formed, at least in part, by the hybridization of nucleic acids comprising complementary sequences.

In summary, DPN and APN conducted with the precise control of a driving force are powerful methods for size-selective and site-specific coverage and patterning with a wide variety of deposition compounds and even single molecules. These are comparable or even higher resolutions than those achieved with much more expensive and sophisticated competitive lithographic methods, such as electron-beam lithography. DPN and APN are also useful tools for creating microscale and nanoscale structures. For instance, these nanolithography techniques can be used in the fabrication of microsensors, microreactors, combinatorial arrays, micromechanical systems, microanalytical systems, biosurfaces, biomaterials, microelectronics, microoptical systems, and nanoelectronic devices. See, e.g., Xia and Whitesides, *Angew. Chem. Int. Ed.*, 37, 550-575 (1998).

It is to be noted that the term "a" or "an" entity refers to one or more of that entity, including mixtures of the entities of two or more of the entities. As such, the terms "a" (or "an"), "one or more" and "at least one" are used interchangeably herein. It is also to be noted that the terms "comprising," "including," and "having" have been used interchangeably.

While various embodiments of the present invention have been described in detail, it is apparent that modifications and adaptations of those embodiments will occur to those skilled in the art. However, it is to be expressly understood that such modifications and adaptations are within the spirit and scope of the present invention, as set forth in the following claims.

What is claimed is:

1. A method of nanolithography, comprising:
    providing a substrate;
    providing a tip comprising an internal cavity having an external opening to the surface of said tip, wherein said opening comprises an internal diameter of less than about 200 nanometers
    loading said cavity with a deposition compound, wherein said deposition compound does not pass through said external opening in the absence of a driving force; and
    subjecting said tip to a driving force to deliver said deposition compound through said external opening to be deposited on said substrate;
    wherein said internal cavity comprises a medium semipermeable to said deposition compound.

2. The method of claim 1, wherein said deposition compound passes through said medium through the external opening onto said substrate.

3. The method of claim 1, wherein said medium is at least one of a polymeric gel and a liquid suspension.

4. The method of claim 1, wherein said deposition compound is a biomolecule.

5. The method of claim 1, wherein the substrate is gold and the deposition compound is a protein or peptide or has the formula $R_1SH$, $R_1SSR_2$, $R_1SR_2$, $R_1SO_2H$, $(R_1)_3P$, $R_1NC$, $R_1CN$, $(R_1)_3N$, $R_1COOH$, or ArSH, wherein:
    $R_1$ and $R_2$ each has the formula $X(CH_2)_n$ and, if a compound is substituted with both $R_1$ and $R_2$, then $R_1$ and $R_2$ can be the same or different;
    n is 0-30;
    Ar is an aryl;
    X is $-CH_3$, $-CHCH_3$, $-COOH$, $-CO_2(CH_2)_mCH_3$, $-OH$, $-CH_2OH$, ethylene glycol, hexa(ethylene glycol), $-O(CH_2)_mCH_3$, $-NH_2$, $-NH(CH_2)_mNH_2$, halogen, glucose, maltose, fullerene C60, a nucleic acid, a protein, or a ligand; and
    m is 0-30.

6. The method of claim 5, wherein the deposition compound has the formula $R_1SH$ or ArSH.

7. The method of claim 1, wherein the substrate is aluminum, gallium arsenide or titanium dioxide and the deposition compound has the formula $R_1SH$, wherein:
    $R_1$ has the formula $X(CH_2)_n$;
    n is 0-30;
    X is $-CH_3$, $-CHCH_3$, $-COOH$, $-CO_2(CH_2)_mCH_3$, $-OH$, $-CH_2OH$, ethylene glycol, hexa(ethylene glycol), $-O(CH_2)_mCH_3$, $-NH_2$, $-NH(CH_2)_mNH_2$, halogen, glucose, maltose, fullerene C60, a nucleic acid, a protein, or a ligand; and
    m is 0-30.

8. The method of claim 1, wherein the deposition compound is selected from the group consisting of 2-mercaptoacetic acid and n-octadecanethiol.

9. The method of claim 1, wherein the substrate is silicon dioxide and the deposition compound is selected from the group consisting of a protein, a peptide and a compound having the formula $R_1SH$ or $R_1SiCl_3$, wherein:
    $R_1$ has the formula $X(CH_2)_n$;
    n is 0-30;
    X is $-CH_3$, $-CHCH_3$, $-COOH$, $-CO_2(CH_2)_mCH_3$, $-OH$, $-CH_2OH$, ethylene glycol, hexa(ethylene glycol), $-O(CH_2)_mCH_3$, $-NH_2$, $-NH(CH_2)_mNH_2$, halogen, glucose, maltose, fullerene C60, a nucleic acid, a protein, or a ligand; and
    m is 0-30.

10. The method of claim 1, wherein the deposition compound is 16-mercapto-1-hexadecanoic acid, octadecyltrichlorosilane or 3-(2-aminoethylamino)propyltrimethoxysilane.

11. The method of claim 1, wherein the substrate is oxidized gallium arsenide or silicon dioxide and the deposition compound is a silazane.

12. The method of claim 1, wherein said external opening comprises an internal diameter of about 1 nanometers to about 15 nanometers.

13. The method of claim 1, wherein movement of said deposition compound is achieved by said driving force.

14. The method of claim 13, wherein said driving force is selected from the group consisting of an electrical, a magnetic and a chemical driving force.

15. The method of claim 14, wherein said driving force is a chemical driving force created by a substrate having a chemical attraction to said deposition compound.

16. The method of claim 1, wherein said external opening is a size-specific aperture adaptable to sub-nanometer scale features.

17. The method of claim 16, wherein said size-specific aperture is produced by a process selected from the group consisting of focused ion beam, mechanical/ion polishing of narrow tip-cones and electron beam drilling.

18. The method of claim 1, wherein said tip is an atomic force microscope tip.

19. The method of claim 1, wherein said tip is a near field scanning optical microscope tip.

20. The method of claim 1, wherein said tip is coated with a hydrophobic compound.

21. The method of claim 20, wherein the hydrophobic compound has the formula $RNH_2$ wherein:
R is an alkyl of the formula $CH_3(CH_2)_n$ or an aryl; and
n is 0-30.

22. The method of claim 21, wherein the hydrophobic compound is 1-dodecylamine.

23. The method of claim 1, wherein said tip is coated with a hydrophilic compound.

24. A method of nanolithography, comprising:
providing a substrate;
providing a tip comprising an internal cavity having an external opening to the surface of said tip, wherein said opening comprises an internal diameter of less than about 200 nanometers
loading said cavity with a deposition compound, wherein said deposition compound does not pass through said external opening in the absence of a driving force; and
subjecting said tip to a driving force to deliver said deposition compound through said external opening to be deposited on said substrate,
wherein said external opening is a size-specific aperture adaptable to sub-nanometer scale features;
wherein said size-specific aperture is produced by a process selected from the group consisting of focused ion beam, mechanical/ion polishing of narrow tip-cones and electron beam drilling; and
wherein said size-specific aperture comprises an ultra-thin membrane.

25. The method of claim 24, wherein said ultra-thin membrane is about 2 nanometers to about 100 nanometers thick.

26. The method of claim 24, wherein said ultra-thin membrane comprises a substance selected from the group consisting of $SiO_2$, $Si_3N_4$, diamond and amorphous carbon.

27. The method of claim 24, wherein said ultra-thin membrane comprises a circular aperture.

28. The method of claim 24, wherein said ultra-thin membrane comprises a square aperture.

29. A method of nanolithography, comprising:
providing a substrate;
providing a tip comprising an internal cavity having an external opening to the surface of said tip, wherein said opening comprises an internal diameter of less than about 200 nanometers
loading said cavity with a deposition compound, wherein said deposition compound does not pass through said external opening in the absence of a driving force; and
subjecting said tip to a driving force to deliver said deposition compound through said external opening to be deposited on said substrate,
wherein said external opening is a size-specific aperture adaptable to sub-nanometer scale features; and
wherein said size-specific aperture comprises an ultra-thin crystalline membrane.

30. The method of claim 29, wherein said ultra-thin crystalline membrane is selected from the group consisting of magnesium oxide, sapphire, diamond and semiconductors.

* * * * *

UNITED STATES PATENT AND TRADEMARK OFFICE
CERTIFICATE OF CORRECTION

PATENT NO. : 7,722,928 B2
APPLICATION NO. : 11/100483
DATED : May 25, 2010
INVENTOR(S) : Chad A. Mirkin, Seunghun Hong and Vinayak P. Dravid It is certified that error appears in the above-identified patent and that said Letters Patent is hereby corrected as shown below:

Column 1, lines 16-19 "This invention was made with government support under grant(s) [F49620-96-1-0155] from [Air Force Office of Scientific Research]. The U.S. government has rights in the invention." should read. --This invention was made with government support under Grant No. F49620-96-1-0155 awarded by the Air Force Office of Scientific Research (AFOSR). The government has certain rights in the invention.--

Signed and Sealed this

Ninth Day of November, 2010

David J. Kappos
*Director of the United States Patent and Trademark Office*